United States Patent
de Larios et al.

(10) Patent No.: US 8,043,441 B2
(45) Date of Patent: *Oct. 25, 2011

(54) METHOD AND APPARATUS FOR CLEANING A SUBSTRATE USING NON-NEWTONIAN FLUIDS

(75) Inventors: John M. de Larios, Palo Alto, CA (US);
Mike Ravkin, Sunnyvale, CA (US);
Jeffrey Farber, Delmar, NY (US);
Mikhail Korolik, San Jose, CA (US);
Fred C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 534 days.

This patent is subject to a terminal disclaimer.

(21) Appl. No.: 11/153,957

(22) Filed: Jun. 15, 2005

(65) Prior Publication Data

US 2006/0283486 A1    Dec. 21, 2006

(51) Int. Cl.
*B08B 3/00* (2006.01)
(52) U.S. Cl. .............. 134/34; 134/36; 134/902
(58) Field of Classification Search ............ 134/34, 134/902
See application file for complete search history.

(56) References Cited

U.S. PATENT DOCUMENTS

| | | | |
|---|---|---|---|
| 3,037,887 A | 6/1962 | Brenner et al. | 134/22 |
| 3,212,762 A | 10/1965 | Carroll et al. | 261/124 |
| 3,436,262 A | 4/1969 | Crowe et al. | 134/10 |
| 3,617,095 A | 11/1971 | Lissant | 406/197 |
| 3,978,176 A | 8/1976 | Voegeli | 261/122 |
| 4,085,059 A | 4/1978 | Smith et al. | 134/26 |
| 4,133,773 A | 1/1979 | Simmons | 261/21 |
| 4,156,619 A | 5/1979 | Griesshammer | 134/2 |
| 4,238,244 A | 12/1980 | Banks | 134/22 |
| 4,633,893 A | 1/1987 | McConnell et al. | |
| 4,781,764 A | 11/1988 | Leenaars | 134/34 |
| 4,817,652 A | 4/1989 | Liu et al. | 134/102 |
| 4,838,289 A | 6/1989 | Kottman et al. | 134/153 |
| 4,849,027 A | 7/1989 | Simmons | 134/22 |
| 4,911,761 A | 3/1990 | McConnell et al. | 134/11 |
| 4,962,776 A | 10/1990 | Liu et al. | 134/11 |
| 5,000,795 A | 3/1991 | Chung et al. | 134/37 |

(Continued)

FOREIGN PATENT DOCUMENTS

DE    40-38-587    6/1992

(Continued)

OTHER PUBLICATIONS

Aubert, JM et al.; "Aqueous foams"; Scientific America; 1986, 74-82, 254.

(Continued)

*Primary Examiner* — Michael Kornakov
*Assistant Examiner* — Eric Golightly
(74) *Attorney, Agent, or Firm* — Martine Penilla & Gencarella, LLP

(57) ABSTRACT

A method for cleaning a substrate is provided. In this method, a flow of non-Newtonian fluid is provided where at least a portion of the flow exhibits plug flow. To remove particles from a surface of the substrate, the surface of the substrate is placed in contact with the portion of the flow that exhibits plug flow such that the portion of the flow exhibiting plug flow moves over the surface of the substrate. Additional methods and apparatuses for cleaning a substrate also are described.

7 Claims, 12 Drawing Sheets

U.S. PATENT DOCUMENTS

| | | | | |
|---|---|---|---|---|
| 5,048,549 | A | 9/1991 | Hethcoat | 134/122 R |
| 5,102,777 | A | 4/1992 | Lin et al. | 430/331 |
| 5,105,556 | A | 4/1992 | Kurokawa et al. | 34/12 |
| 5,113,597 | A | 5/1992 | Sylla | 34/22 |
| 5,175,124 | A | 12/1992 | Winebarger | 437/180 |
| 5,181,985 | A | 1/1993 | Lampert et al. | 156/635 |
| 5,226,969 | A | 7/1993 | Watanabe et al. | 134/7 |
| 5,242,669 | A | 9/1993 | Flor | 423/465 |
| 5,271,774 | A | 12/1993 | Leenaars et al. | 134/31 |
| 5,288,332 | A | 2/1994 | Pustilnik et al. | 134/27 |
| 5,306,350 | A | 4/1994 | Hoy et al. | 134/22.14 |
| 5,336,371 | A | 8/1994 | Chung et al. | 156/659.1 |
| 5,415,191 | A | 5/1995 | Mashimo et al. | 134/102.1 |
| 5,417,768 | A | 5/1995 | Smith et al. | 134/10 |
| 5,464,480 | A | 11/1995 | Matthews | 134/1.3 |
| 5,472,502 | A | 12/1995 | Batchelder | 118/52 |
| 5,494,526 | A | 2/1996 | Paranjpe | 134/1 |
| 5,498,293 | A | 3/1996 | Ilardi et al. | 134/3 |
| 5,656,097 | A | 8/1997 | Olesen et al. | 134/1 |
| 5,660,642 | A | 8/1997 | Britten | 134/30 |
| 5,705,223 | A | 1/1998 | Bunkofske | 427/240 |
| 5,800,626 | A | 9/1998 | Cohen et al. | 134/1.3 |
| 5,858,283 | A | 1/1999 | Burris | 261/122.1 |
| 5,900,191 | A | 5/1999 | Gray et al. | 261/59 |
| 5,904,156 | A | 5/1999 | Advocate, Jr. et al. | 134/2 |
| 5,908,509 | A | 6/1999 | Olesen et al. | 134/1.3 |
| 5,911,837 | A | 6/1999 | Matthews | 134/2 |
| 5,932,493 | A | 8/1999 | Akatsu et al. | 438/745 |
| 5,944,581 | A | 8/1999 | Goenka | 431/39 |
| 5,944,582 | A | 8/1999 | Talieh | 451/41 |
| 5,945,351 | A | 8/1999 | Mathuni | 438/706 |
| 5,951,779 | A | 9/1999 | Koyanagi et al. | 134/2 |
| 5,964,954 | A | 10/1999 | Matsukawa et al. | 134/6 |
| 5,964,958 | A | 10/1999 | Ferrell et al. | 134/26 |
| 5,968,285 | A | 10/1999 | Ferrell et al. | 134/26 |
| 5,997,653 | A | 12/1999 | Yamasaka | 134/2 |
| 6,048,409 | A | 4/2000 | Kanno et al. | 134/34 |
| 6,049,996 | A | 4/2000 | Freeman et al. | 34/362 |
| 6,081,650 | A | 6/2000 | Lyons et al. | 386/95 |
| 6,090,217 | A | 7/2000 | Kittle | 134/11 |
| 6,092,538 | A | 7/2000 | Arai et al. | 134/1.3 |
| 6,152,805 | A | 11/2000 | Takahashi | 451/36 |
| 6,158,445 | A | 12/2000 | Olesen et al. | 134/1.3 |
| 6,167,583 | B1 | 1/2001 | Miyashita et al. | 15/77 |
| 6,225,235 | B1* | 5/2001 | Kunze-Concewitz | 438/745 |
| 6,228,563 | B1 | 5/2001 | Starov et al. | 430/327 |
| 6,267,125 | B1 | 7/2001 | Bergman et al. | 134/102.1 |
| 6,270,584 | B1 | 8/2001 | Ferrell et al. | 134/26 |
| 6,272,712 | B1 | 8/2001 | Gockel et al. | 15/77 |
| 6,276,459 | B1 | 8/2001 | Herrick et al. | 169/14 |
| 6,286,231 | B1 | 9/2001 | Bergman et al. | 34/410 |
| 6,290,780 | B1 | 9/2001 | Ravkin | 134/6 |
| 6,296,715 | B1 | 10/2001 | Kittle | 134/2 |
| 6,319,801 | B1 | 11/2001 | Wake et al. | 438/585 |
| 6,352,082 | B1 | 3/2002 | Mohindra et al. | 134/25.4 |
| 6,386,956 | B1 | 5/2002 | Sato et al. | 451/57 |
| 6,398,975 | B1 | 6/2002 | Mertens et al. | 216/92 |
| 6,401,734 | B1 | 6/2002 | Morita et al. | 134/153 |
| 6,423,148 | B1 | 7/2002 | Aoki | 134/3 |
| 6,439,247 | B1 | 8/2002 | Kittle | 134/102.1 |
| 6,457,199 | B1 | 10/2002 | Frost et al. | 15/77 |
| 6,488,040 | B1* | 12/2002 | de Larios et al. | 134/95.2 |
| 6,491,043 | B2 | 12/2002 | Mohindra et al. | 134/25.4 |
| 6,491,764 | B2 | 12/2002 | Mertens et al. | 134/36 |
| 6,493,902 | B2 | 12/2002 | Lin | 15/302 |
| 6,513,538 | B2 | 2/2003 | Chung et al. | 134/1.2 |
| 6,514,921 | B1 | 2/2003 | Kakizawa | 510/175 |
| 6,527,870 | B2 | 3/2003 | Gotikis | 134/6 |
| 6,532,976 | B1 | 3/2003 | Huh et al. | 134/111 |
| 6,537,915 | B2 | 3/2003 | Moore et al. | 438/692 |
| 6,562,726 | B1 | 5/2003 | Torek et al. | 438/745 |
| 6,576,066 | B1 | 6/2003 | Namatsu | 134/36 |
| 6,594,847 | B1 | 7/2003 | Krusell et al. | 15/102 |
| 6,616,772 | B2 | 9/2003 | de Larios et al. | 134/21 |
| 6,733,596 | B1 | 5/2004 | Mikhaylichenko et al. | 134/6 |
| 6,787,473 | B2 | 9/2004 | Andreas | 438/692 |
| 6,797,071 | B2 | 9/2004 | Kittle | 134/11 |
| 6,802,911 | B2 | 10/2004 | Lee et al. | 134/28 |
| 6,846,380 | B2 | 1/2005 | Dickinson et al. | 156/354.31 |
| 6,851,435 | B2 | 2/2005 | Mertens et al. | 134/99.1 |
| 6,874,516 | B2 | 4/2005 | Matsuno et al. | 134/148 |
| 6,896,826 | B2 | 5/2005 | Wojtczak et al. | 252/79.1 |
| 6,927,176 | B2 | 8/2005 | Verhaverbeke et al. | 438/745 |
| 6,946,396 | B2 | 9/2005 | Miyazawa et al. | 438/689 |
| 6,951,042 | B1 | 10/2005 | Mikhaylichenko et al. | 15/77 |
| 7,122,126 | B1 | 10/2006 | Fuentes | 216/689 |
| 7,591,613 | B2* | 9/2009 | de Larios et al. | 406/27 |
| 2002/0072482 | A1 | 6/2002 | Sachdev et al. | 510/175 |
| 2002/0094684 | A1* | 7/2002 | Hirasaki et al. | 438/689 |
| 2002/0121290 | A1 | 9/2002 | Tang et al. | 134/6 |
| 2002/0185164 | A1 | 12/2002 | Tetsuka et al. | 134/148 |
| 2002/0195121 | A1 | 12/2002 | Kittle | |
| 2003/0075204 | A1 | 4/2003 | de Larios et al. | 134/21 |
| 2003/0148903 | A1 | 8/2003 | Bargaje et al. | 510/130 |
| 2003/0171239 | A1* | 9/2003 | Patel et al. | 510/406 |
| 2003/0226577 | A1 | 12/2003 | Orll et al. | 134/1.3 |
| 2004/0002430 | A1 | 1/2004 | Verhaverbeke | 510/175 |
| 2004/0053808 | A1 | 3/2004 | Raehse et al. | 510/447 |
| 2004/0134515 | A1 | 7/2004 | Castrucci | 134/2 |
| 2004/0159335 | A1 | 8/2004 | Montierth et al. | |
| 2004/0163681 | A1 | 8/2004 | Verhaverbeke | 134/28 |
| 2004/0261823 | A1 | 12/2004 | de Larios | 134/31 |
| 2005/0045209 | A1 | 3/2005 | Tan | 134/18 |
| 2005/0132515 | A1 | 6/2005 | Boyd et al. | 15/77 |
| 2005/0133060 | A1 | 6/2005 | de Larios et al. | 134/1.3 |
| 2005/0133061 | A1 | 6/2005 | de Larios et al. | 134/6 |
| 2005/0159322 | A1 | 7/2005 | Min et al. | 510/175 |
| 2005/0176606 | A1 | 8/2005 | Konno et al. | 510/175 |
| 2005/0183740 | A1 | 8/2005 | Fulton et al. | 134/3 |
| 2006/0201267 | A1 | 9/2006 | Liu | 74/89.2 |
| 2006/0283486 | A1 | 12/2006 | de Larios et al. | 134/34 |
| 2006/0285930 | A1 | 12/2006 | de Larios et al. | 406/197 |
| 2007/0000518 | A1 | 1/2007 | Korolik et al. | |

FOREIGN PATENT DOCUMENTS

| | | |
|---|---|---|
| EP | 0827188 | 3/1998 |
| EP | 0905746 | 3/1999 |
| EP | 11-334874 | 12/1999 |
| EP | 0989600 | 3/2000 |
| JP | 53-076559 | 7/1978 |
| JP | 56-084618 | 7/1981 |
| JP | 56-084619 | 7/1981 |
| JP | 59-24849 | 2/1984 |
| JP | 60-005529 | 1/1985 |
| JP | 62-119543 | 5/1987 |
| JP | 63-077510 | 4/1988 |
| JP | 02-309638 A | 12/1990 |
| JP | 5-15857 | 1/1993 |
| JP | 06-177101 | 6/1994 |
| JP | 07-006993 | 1/1995 |
| JP | 11-350169 | 12/1999 |
| JP | 2001-064688 | 3/2001 |
| JP | 2002-66475 | 3/2002 |
| JP | 2002-280330 | 9/2002 |
| JP | 2002-309638 | 10/2002 |
| JP | 2003-282513 | 10/2003 |
| JP | 2005-194294 | 7/2005 |
| WO | WO-99/16109 | 4/1999 |
| WO | WO-00/33980 | 6/2000 |
| WO | WO-00/59006 | 10/2000 |
| WO | WO-01/12384 | 2/2001 |
| WO | WO-02/101795 | 12/2002 |
| WO | WO-2005/006424 | 1/2005 |
| WO | WO 2005/064647 A1 | 7/2005 |

OTHER PUBLICATIONS

Kittle, et al.; "Semiconductor Wafer Cleaning and Drying Using a Foam Medium"; <hhttp://www.aquafoam.com/papers;SCI0202.pdf>; Sematech Novel Wafer Cleans Working Group Meeting, Internet Presetation; Nov. 13, 2001.

Hunter; "Introduction to Modern Colloid Science"; Oxford University Press; Feb. 1, 1994.

Lester; "Advanced Wafer-Cleaning Evolution"; <http://www.aquafoam.com/papers/SCI0202.pdf>; Semiconductor International, 25, #2; Feb. 1, 2002.

Kirkpatrick et al.; "Advanced Wafer-Cleaning Evolution"; Solid State Technology; May 1, 2003; www.solid-state.com.
Weaire et al.; "The Physics of Foams"; Department of Physics; Trinity Collge, Dublin; 1999.
Kittle, et al.; "Photoreisist Removal Using Aqueous Foam"; Internet; http://www.aquafoam.com/paper/SCCPresentation.pdf.
Kittle, et al.; "Aqueous Foam Drying and Cleaning of Semiconductor Wafers"; Internet; http://www.aquafoam.com/paper/SCCPresentation.pdf.
Kittle, et al.; "Foam Wafer Cleaning—Experimental Proof of Concept"; Internet; http://www.aquafoam.com/paper/Removalall.pdf.
Kittle, et al.; "Particulate Removal Using a Foam Medium"; Internet; http://www.aquafoam.com/paper/particulate.pdf.
Kittle, et al. "Removing Particles with a Foam Medium" Internet http://www.aquafoam.com/paper/A2C2foamedium.pdf.
Kittle, et al.; "Photoresist Residue Removal Using Aqueous Foam Proof of Concept Experiments"; Internet; http://www.aquafoam.com/paper/Proof-11MB.pdf;<papers/A2C2photoresist.pdf>; 13-17; May 1, 2002.
Lide; "Air Composition"; CRC handbook of Chemistry and Physics; 1997.
U.S. Appl. No. 11/639,752, filed Dec. 15, 2006, Boyd et al.
U.S. Appl. No. 11/743,283, filed May 2, 2007, Freer et al.
European Search Report (3 pages).

* cited by examiner

US 8,043,441 B2

METHOD AND APPARATUS FOR CLEANING A SUBSTRATE USING NON-NEWTONIAN FLUIDS

CROSS REFERENCE TO RELATED APPLICATIONS

This application is related to U.S. patent application Ser. No. 11/154,129, which has matured to U.S. Pat. No. 7,416,370, filed on Jun. 15, 2005, and entitled "Method and Apparatus for Transporting a Substrate Using Non-Newtonian Fluid," and is related to U.S. patent application Ser. No. 10/261,839 which has matured to U.S. Pat. No. 7,234,477, filed on Sep. 30, 2002, and entitled "Method and Apparatus for Drying Semiconductor Wafer Surfaces Using a Plurality of Inlets and Outlets Held in Close Proximity to the Wafer Surfaces," the disclosure of these applications are incorporated herein by reference in their entirety for all purposes.

BACKGROUND

Throughout a semiconductor device manufacturing process, a semiconductor wafer is cleaned to remove particles, such as contamination from a depositions system, from the surface of the semiconductor wafer. If the particles are not removed, the particles will contaminate the semiconductor wafer resulting in damage to the electronic devices on the semiconductor wafer. As such, cleaning operations define a very critical step that is repeated many times throughout the manufacturing process.

One method to clean the semiconductor wafer is to rinse the surface of the semiconductor wafer with deionized water. However, cleaning the semiconductor water with water is terribly inefficient because the process uses an immense amount of water to remove only a very minute amount of contaminant. Specifically, the inefficiency is caused by the Newtonian properties of water. FIG. 1 is a shear stress and strain diagram of water. The shear stress and strain diagram is a plot of a shear strain rate versus shear stress. As shown in FIG. 1, the shear strain rate and shear stress of water plot as a straight line on the diagram. Thus, water (and all Newtonian fluids) is characterized by having a shear stress that is linearly proportional to the shear strain rate. The plot goes through origin 101 of the diagram. Accordingly, any finite shear stress applied on the water can initiate flow. In other words, water has minimal or no yield point, which is the minimum force required to initiate flow in water.

FIG. 2 is a velocity flow profile for a flow of water on a surface of semiconductor wafer 202. As shown in FIG. 2, since water has virtually no yield point, the velocity of the water in contact with the surface of semiconductor wafer 202 is essentially zero and the velocity increases the further away from the semiconductor wafer. Accordingly, water is essentially stagnant at the point of contact with surface of semiconductor wafer 202. Since the water just above the surface of semiconductor wafer 202 is not moving, there is no mechanism for the flow of water to carry away particles at the surface of the semiconductor water. Accordingly, a large amount of water flow is needed to create any significant velocity at the surface of semiconductor wafer 202 to enable removal of particles from the surface.

In view of the foregoing, there is a need to provide methods and apparatuses that use fluids more efficiently to clean semiconductor wafers.

SUMMARY

Broadly speaking, the present invention fills these needs by providing methods and apparatuses for cleaning a substrate. It should be appreciated that the present invention can be implemented in numerous ways, including as a method, a system, or a device. Several inventive embodiments of the present invention are described below.

In accordance with a first aspect of the present invention, a method for cleaning a substrate is provided. In this method, a flow of a non-Newtonian fluid is provided where at least a portion of the flow exhibits plug flow. To remove particles from a surface of the substrate, the surface of the substrate is placed in contact with the portion of the flow that exhibits plug flow such that the portion of the flow exhibiting plug flow moves over the surface of the substrate.

In accordance with a second aspect of the present invention, a method for cleaning a substrate is provided. In this method, a chamber is filled with a non-Newtonian fluid and the substrate is placed into the chamber. Thereafter, additional non-Newtonian fluids are forced into the chamber to create a flow of the non-Newtonian fluid where at least a portion of the flow exhibits plug flow. The substrate is placed within the chamber such that the portion of the flow exhibiting plug flow moves over a surface of the substrate to enable removal of particles from the surface.

In accordance with a third aspect of the present invention, a method for cleaning a substrate is provided. In this method, a surface of an application unit is provided and the application unit is disposed above a surface of the substrate. A flow of a non-Newtonian fluid is applied between the surface of the application unit and the surface of the substrate. At least a portion of the flow exhibits plug flow such that the portion of the flow exhibiting plug flow moves over the surface of the substrate to enable removal of particles from the surface of the substrate.

In accordance with a fourth aspect of the present invention, an apparatus for cleaning a substrate is provided. The apparatus is an application unit configured to be disposed above a surface of the substrate and configured to receive a non-Newtonian fluid. The application unit is capable of applying the non-Newtonian fluid to the surface to create a flow of the non-Newtonian fluid between the application unit and the surface. The flow has a portion that exhibits plug flow such that the plug flow moves over the surface to enable removal of particles from the surface.

In accordance with a fifth aspect of the present invention, an apparatus for cleaning a substrate is provided. The apparatus includes a chamber that has a cavity in a form of a conduit. The conduit is capable of conveying a flow of a non-Newtonian fluid such that a portion of the flow exhibits plug flow. Further, the chamber is configured to contain the substrate such that the plug flow moves over a surface of the substrate to enable removal of particles from the surface.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for methods and apparatuses for cleaning a substrate. It will be obvious, however, to one skilled in the art, that the present invention may be practiced without some or all of these specific details. In other instances, well known process operations have not been described in detail in order not to unnecessarily obscure the present invention.

The embodiments described herein provide methods and apparatuses for cleaning a substrate. Essentially, non-Newtonian fluids that have the capability to flow as plug flow are used to clean the substrate. As will be explained in more detail below, a flow of non-Newtonian fluid is provided and at least a portion of the flow exhibits plug flow. To clean the substrate, a surface of the substrate is placed in contact with the portion of the flow that exhibits plug flow. In one embodiment, the flow of non-Newtonian fluid is applied to the surface of the substrate such that the portion of the flow exhibiting plug flow flows over the surface of the substrate. In another embodiment, the substrate is immersed in the flow of non-Newtonian fluid that exhibits plug flow.

Figure 1:
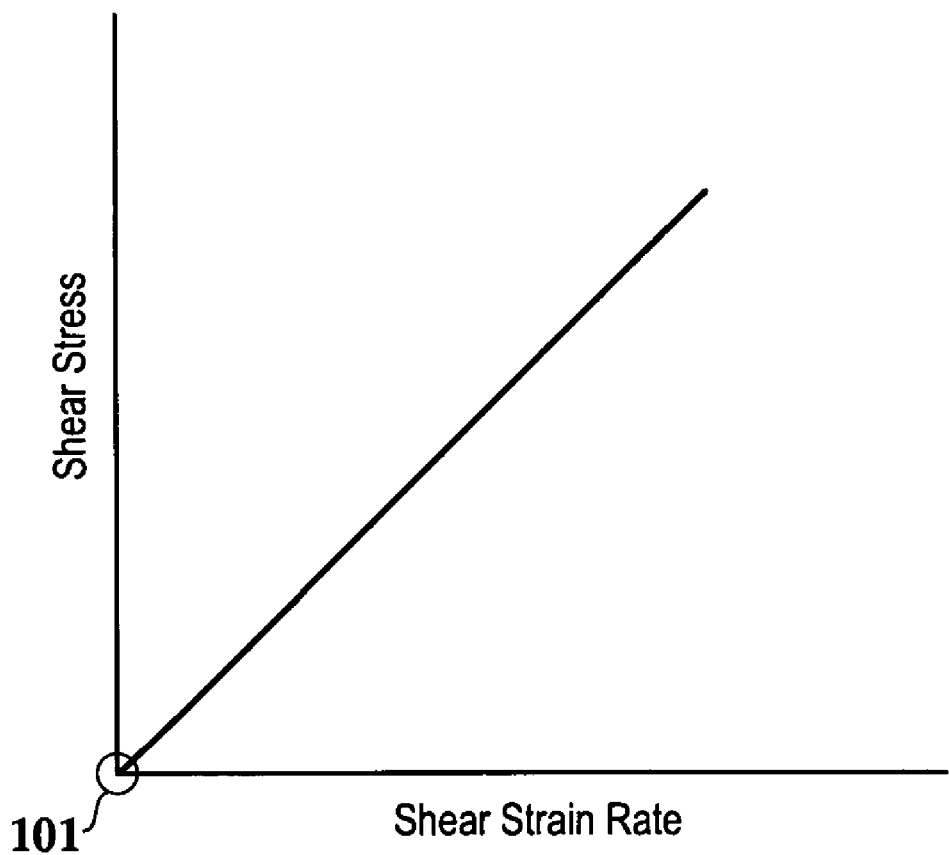
FIG. 1 is a shear stress and strain diagram of water.
Figure 2:
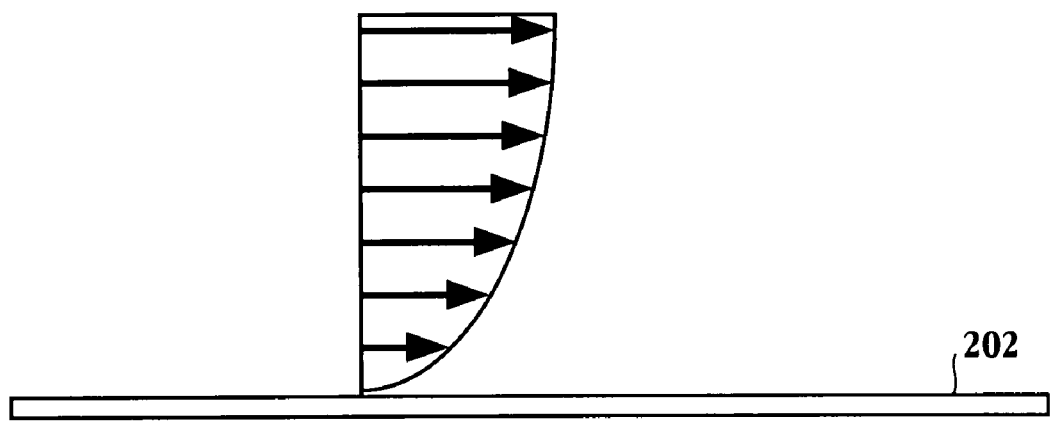
FIG. 2 is a velocity flow profile for a flow of water on a surface of a semiconductor wafer.
Figure 3:
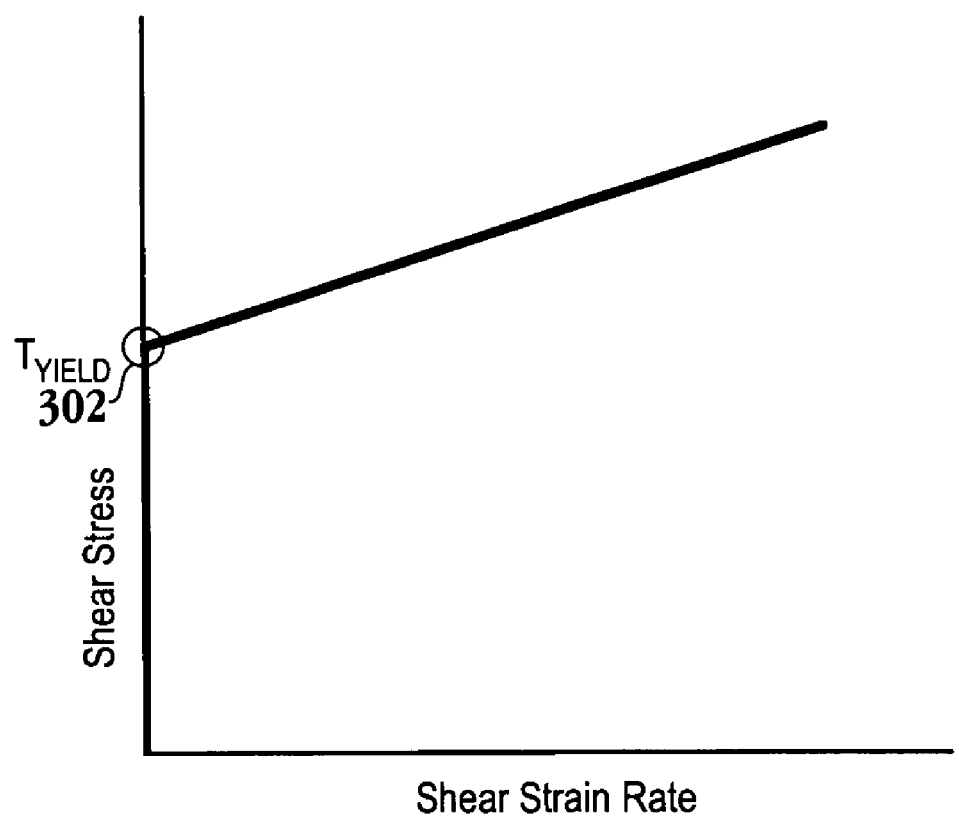
FIG. 3 is a shear stress and strain diagram of a non-Newtonian fluid, in accordance with one embodiment of the present invention.

FIG. 3 is a shear stress and strain diagram of a non-Newtonian fluid, in accordance with one embodiment of the present invention. A non-Newtonian fluid is a fluid that does not flow when an applied shear force approaches zero. In particular, as shown in FIG. 3, the non-Newtonian fluid is characterized by having a yield point 302 ($\tau_{yield}$), which is the minimum force, or shear stress, required to initiate flow in the non-Newtonian fluid. An example of a non-Newtonian fluid is a soft condensed matter which occupies a middle ground between the extremes of a solid and a liquid. The soft condensed matter is easily deformable by external stress and examples of the soft condensed matter include emulsions, colloids, foam, etc. It should be appreciated that an emulsion is a mixture of immiscible liquids such as, for example, toothpaste, mayonnaise, oil in water, etc. A colloid is polymers dispersed in water, and gelatin is an example of a colloid. Foam is gas bubbles defined in a liquid matrix, and shaving cream is an example of foam.

Figure 4:
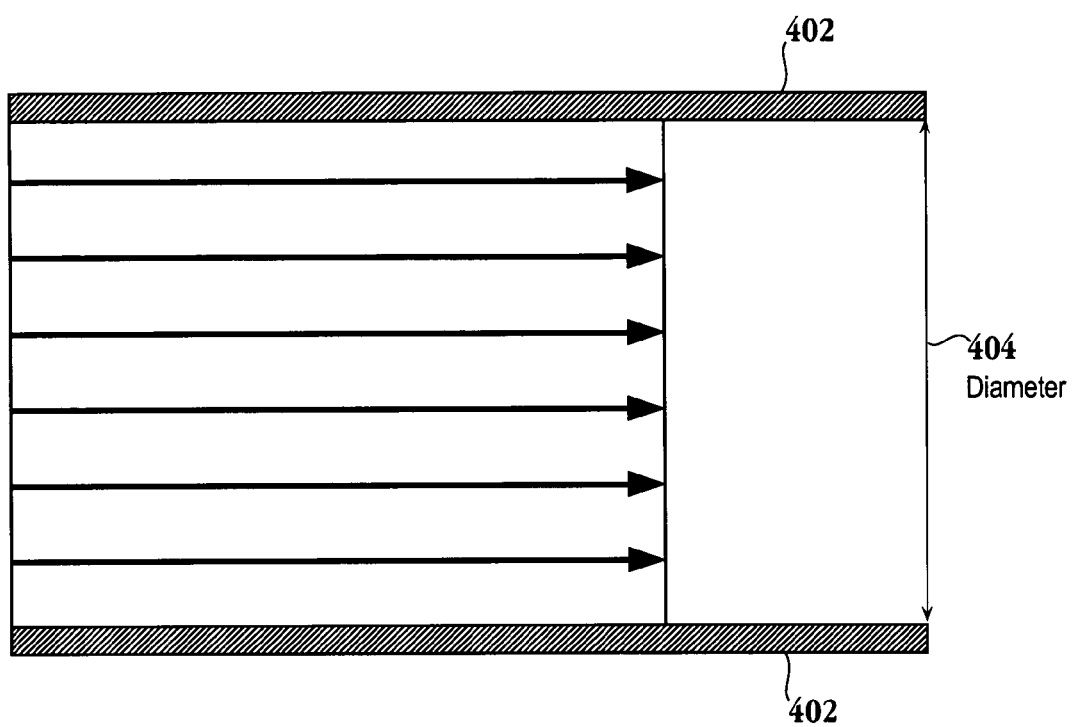
FIG. 4 is a velocity flow profile for a plug flow of a non-Newtonian fluid within a chamber, in accordance with one embodiment of the present invention.

FIG. 4 is a velocity flow profile for a plug flow of a non-Newtonian fluid within a chamber, in accordance with one embodiment of the present invention. In this embodiment, the chamber is in the form of a pipe and FIG. 4 shows the velocity flow profile of any section of the pipe. The non-Newtonian fluid flowing through the pipe has a yield point that is greater than the shear stress applied to the non-Newtonian fluid across diameter 404 of the pipe. As such, the entire amount of flow exhibits plug flow. Plug flow is defined by a flat velocity flow profile where the flow velocities are substantially uniform. In other words, with a plug flow, most of the non-Newtonian fluid material travels through the pipe at substantially the same velocity such that the plug flow has a uniform velocity across diameter 404 of the pipe. Thus, velocities of the non-Newtonian fluid in contact with walls 402 of the pipe approach the velocity of the non-Newtonian fluid at the middle of the pipe. A plug flow therefore can result in a high velocity of the non-Newtonian fluid at or near the vicinities of walls 402.

Figure 5:
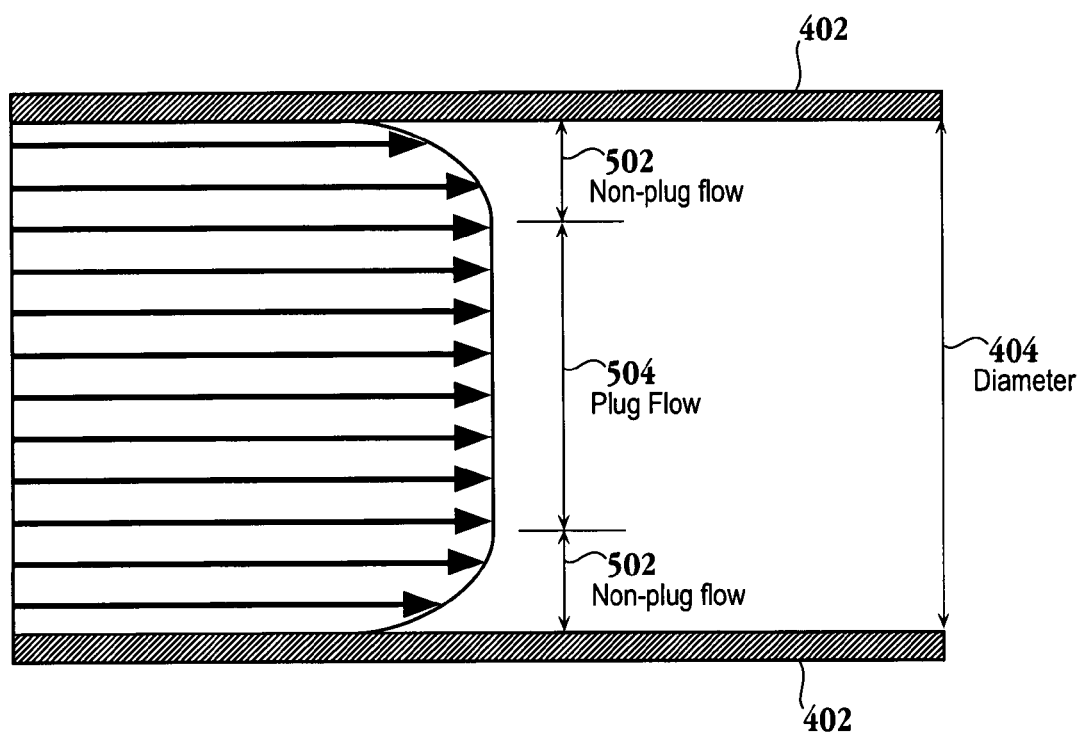
FIG. 5 is another velocity flow profile for a plug flow of a non-Newtonian fluid within the chamber, in accordance with one embodiment of the present invention.

FIG. 5 is another velocity flow profile for a plug flow of a non-Newtonian fluid within the chamber, in accordance with one embodiment of the present invention. The chamber is in the form of a pipe and FIG. 5 shows the velocity flow profile of any section of the pipe. In this embodiment, the shear stress applied to the non-Newtonian fluid flowing through the pipe exceeds the yield point of the non-Newtonian fluid at some portions of the flow. The portions of the flow where the shear stress exceeds the yield point exhibit non-plug flows (i.e., Newtonian flows). A non-plug flow is characterized by a velocity gradient where the fluid velocity decreases from the portion of plug flow to the region of walls 402. On the other hand, the portions of the flow where the yield point is greater than the shear stress exhibit a plug flow. As shown in FIG. 5, the velocity flow profile shows the flow of non-Newtonian fluid having different flow characteristics. Plug flow is not obtained across the entire diameter 404 of the pipe. Specifically, portions 502 of the flow near walls 402 of the pipe exhibit non-plug flows, which are characterized by velocity gradients that have parabolic shaped velocity flow profiles. In contrast, plug flow has a flat shaped velocity flow profile and is exhibited at portion 504 between the velocity flow gradients. FIG. 5 shows that portion 504 of the flow that exhibits plug flow has higher velocities than portions 502 of the flow that exhibit velocity gradients. Accordingly, in the embodiment of FIG. 5, the velocity is highest at portion 504 of the flow that exhibits plug flow.

It should be appreciated that not all non-Newtonian fluids exhibit plug flow. A variety of factors (e.g., applied shear stress, properties of the non-Newtonian fluid, etc.) determine whether a non-Newtonian fluid flows as plug flow. For example, foam (a non-Newtonian fluid) that drains and collapses quickly does not have any significant mechanical strength. Such quick draining foam has virtually no yield point and would most likely not flow as plug flow. In contrast, a high quality foam with a high yield point that drains slowly and can maintain its integrity indefinitely would likely flow as plug flow. There are a variety of methods to increase the yield point of a non-Newtonian fluid. For instance, to increase the yield point of foam, smaller bubbles may be used. Additionally, increasing the amount of surfactants in foam and/or the use of different surfactants can limit foam draining, thereby increasing the yield point of foam. Additional polymers or other binding materials may be added to increase the yield point of the foam and reduce the rate of liquid draining from the foam.

Figure 6:
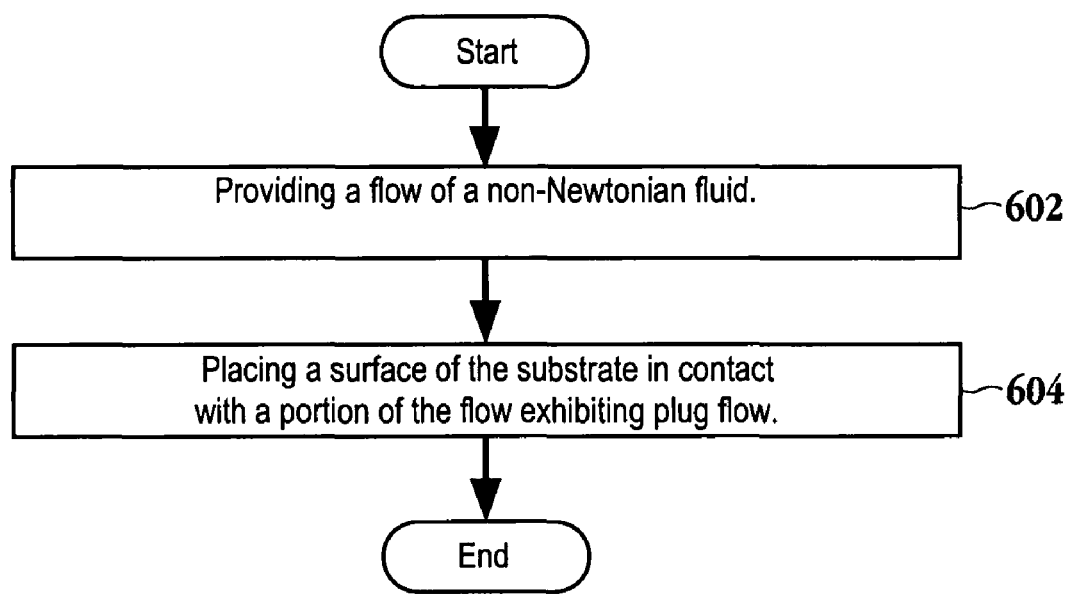
FIG. 6 is a flowchart diagram of a high level overview of a method for cleaning a substrate, in accordance with one embodiment of the present invention.

FIG. 6 is a flowchart diagram of a high level overview of a method for cleaning a substrate, in accordance with one embodiment of the present invention. A substrate is any suitable base material. In one exemplary embodiment, the substrate is a semiconductor wafer, which is a thin slice of semiconductor material, such as a silicon crystal, upon which microcircuits are constructed by diffusion and deposition of various materials. In another exemplary embodiment, the substrate is a hard disk platter, which is composed of a round, rigid plate with a magnetic media coating. Starting in operation 602, a flow of non-Newtonian fluid is provided and at least a portion of the flow exhibits plug flow. In operation 604, a surface of the substrate is placed in contact with the portion of the flow that exhibits plug flow such that the plug flow moves over the surface of the substrate to remove particles from the substrate. The surface of the substrate is placed in contact with the portion of the flow that exhibits plug flow because such portion of the flow has the highest velocity. In effect, the surface of the substrate is placed at a portion of the flow that has the fastest rate of flow. The high velocity of the flow of the non-Newtonian fluid correlates to faster collisions and increased collision frequency with particles on the surface of substrate, thereby creating high friction at the surface of the substrate. The high velocity and resulting high friction correspond to a high rate of particle removal from the surface of the substrate.

Figure 7:
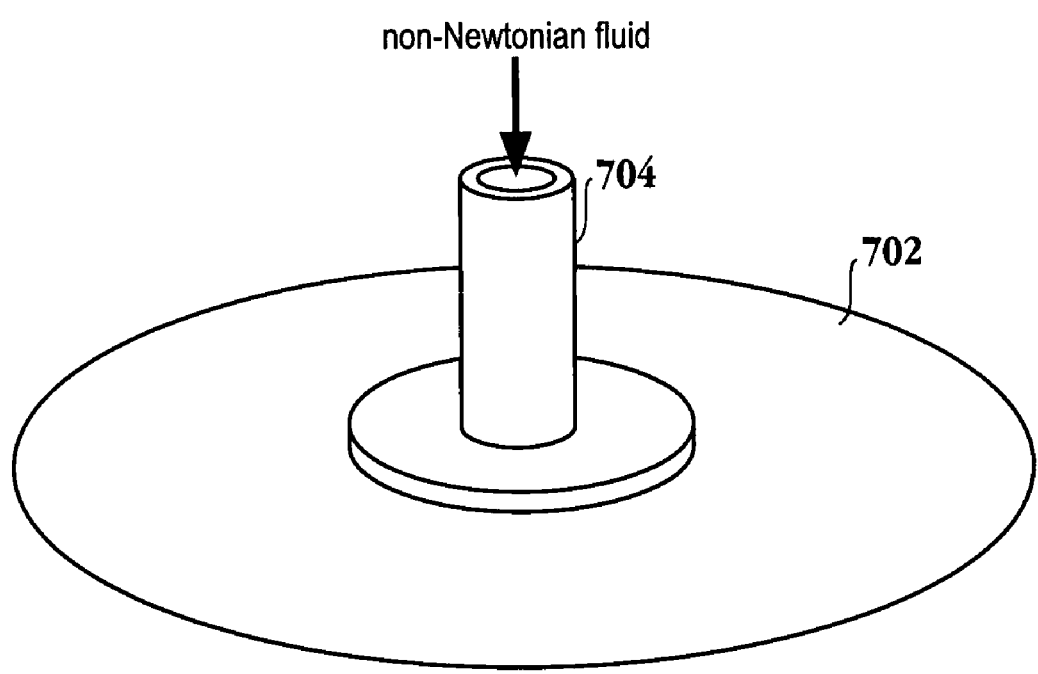
FIG. 7 is a simplified perspective view of an apparatus for cleaning a substrate, in accordance with one embodiment of the present invention.

FIG. 7 is a simplified perspective view of an apparatus for cleaning a substrate, in accordance with one embodiment of the present invention. As shown in FIG. 7, apparatus is an application unit 704 configured to be disposed above a surface of substrate 702. In the embodiment of FIG. 7, application unit 704 does not generate the non-Newtonian fluid but receives the non-Newtonian fluid through any suitable number of inlet conduits that supply the non-Newtonian fluid. Application unit 704 applies the non-Newtonian fluid to surface of substrate 702 to create a flow of the non-Newtonian fluid between the application unit and the surface of the substrate. In one embodiment, application unit 704 can be a proximity head configured to be placed proximate to the surface of substrate 702. The proximity head may not necessarily be a "head" in configuration but may be any suitable configuration, shape and/or size such as, for example, a manifold, a circular puck, a bar, a square, an oval puck, a tube, plate, etc., as long as the proximity may be configured in a manner that would enable the application of non-Newtonian fluid. In one embodiment, the proximity head may be a type of circular puck as illustrated in FIG. 7. The size of the proximity head may be varied to any suitable size depending on the application desired. For more information on proximity heads, reference can be made to U.S. patent application Ser. No. 10/261,839, entitled "Method and Apparatus for Drying Semiconductor Wafer Surfaces Using a Plurality of Inlets and Outlets Held in Close Proximity to the Wafer Surfaces," filed on Sep. 30, 2002, and which is incorporated herein by reference.

Figure 8:
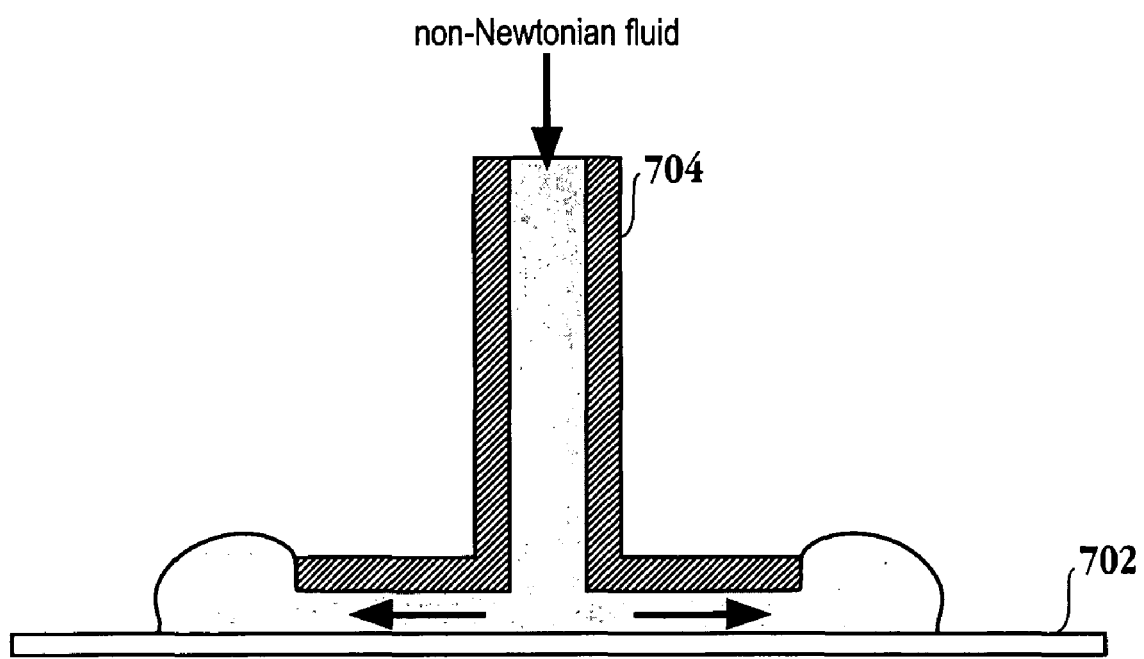
FIG. 8 is a sectional, side view of the application unit shown in FIG. 7.

FIG. 8 is a sectional, side view of the application unit shown in FIG. 7. As shown in FIG. 8, a surface of application unit 704 is disposed above surface of substrate 702. Application unit 704 receives the non-Newtonian fluid through a top inlet conduit, and the application unit applies a flow of the non-Newtonian fluid between the surface of the application unit and the surface of substrate 702. The non-Newtonian fluid flows radially outward from a center of application unit 704 to an outer edge of the application unit and, accordingly, the direction of the flow is substantially parallel to the surface of substrate 702. As will be explained in more detail below, a portion of the flow between the surface of application unit 704 and the surface of substrate 702 exhibits plug flow such that the plug flow moves over the surface of the substrate to remove particles from the surface of the substrate. The rate of flow can be any suitable rate to accommodate a plug flow. For example, in one embodiment, the flow rate has a range from about 0.1 mm/s to about 100 mm/s. As used herein, the term "about" means that that the specified dimension or parameter may be varied within an acceptable tolerance for a given application. In one embodiment, the acceptable tolerance is ±10%.

As shown in FIG. 8, application unit 704 applies the non-Newtonian fluid to a section of substrate 702. To clean the entire surface of substrate 702, application unit 704 can be configured to move over the substrate in a fashion that enables processing of all sections of the substrate. For example, application unit 704 may move in a linear fashion from a center section of substrate 702 to an edge of the substrate. Other embodiments may be utilized where application unit 704 moves in a linear fashion from one edge of substrate 702 to another diametrically opposite edge of the substrate. Other non-linear movements may be utilized such as, for example, in a radical motion, in a circular motion, in a spiral motion, in a zig-zag motion, etc. Application unit 704 can also remain stationary while substrate 702 rotates and/or translates such that the application unit processes all sections of the substrate.

Figure 9:
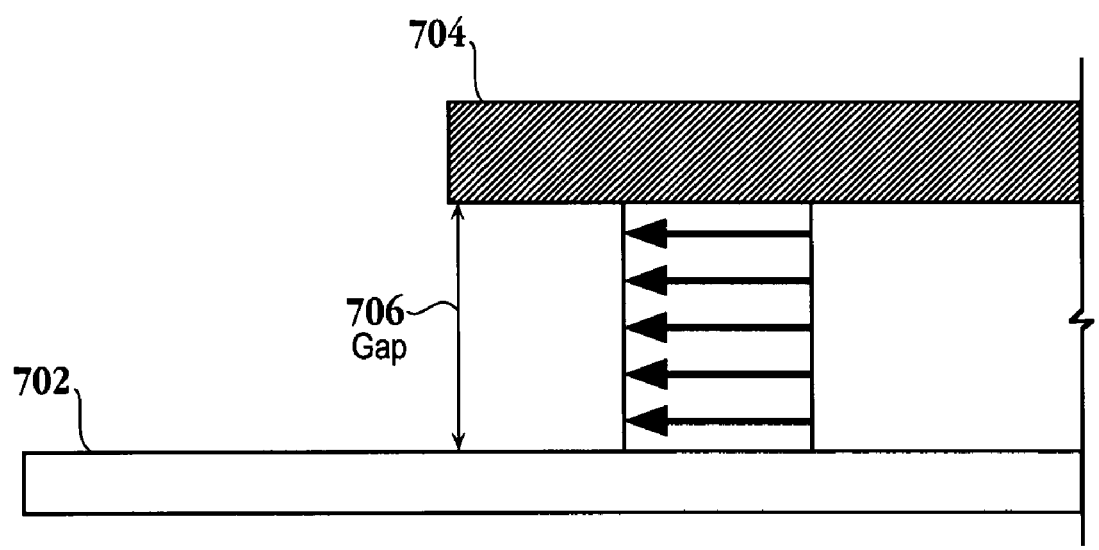
FIG. 9 is a velocity flow profile for a flow of a non-Newtonian fluid between the surface of apparatus and the surface of substrate shown in FIGS. 7 and 8, in accordance with one embodiment of the present invention.

FIG. 9 is a velocity flow profile for a flow of a non-Newtonian fluid between the surface of apparatus and the surface of substrate shown in FIGS. 7 and 8, in accordance with one embodiment of the present invention. The non-Newtonian fluid flowing between the surface of application unit 704 and the surface of substrate 702 has a yield point greater than the shear stress applied to the non-Newtonian fluid across gap 706. Accordingly, a substantial amount of the flow exhibits plug flow. In other words, the portion of the flow that exhibits plug flow extends substantially between the surface of application unit 704 and the surface of substrate 702. Therefore, as shown in FIG. 9, the flow velocity flow profile is substantially uniform. As used herein, in one embodiment, the term "substantially" means that the plug flow extends from about 80% to 100% between the surfaces.

A plug flow can result in a high velocity of the non-Newtonian fluid at the surface of substrate 702. The high velocity flow of the non-Newtonian fluid in contact with the surface of substrate 702 correlates to faster collisions and increased collision frequency with particles on the surface of the substrate, thereby assisting the removal of particles from the surface of the substrate. It should be appreciated that gap 706 between surface of application unit 704 and surface of substrate 702 can have any suitable height to accommodate the flow of non-Newtonian fluid. In one exemplary embodiment, gap 706 between the surface of application unit 704 and the surface of substrate 702 has a height in a range from about 50 microns to about 10 millimeters.

Figure 10:
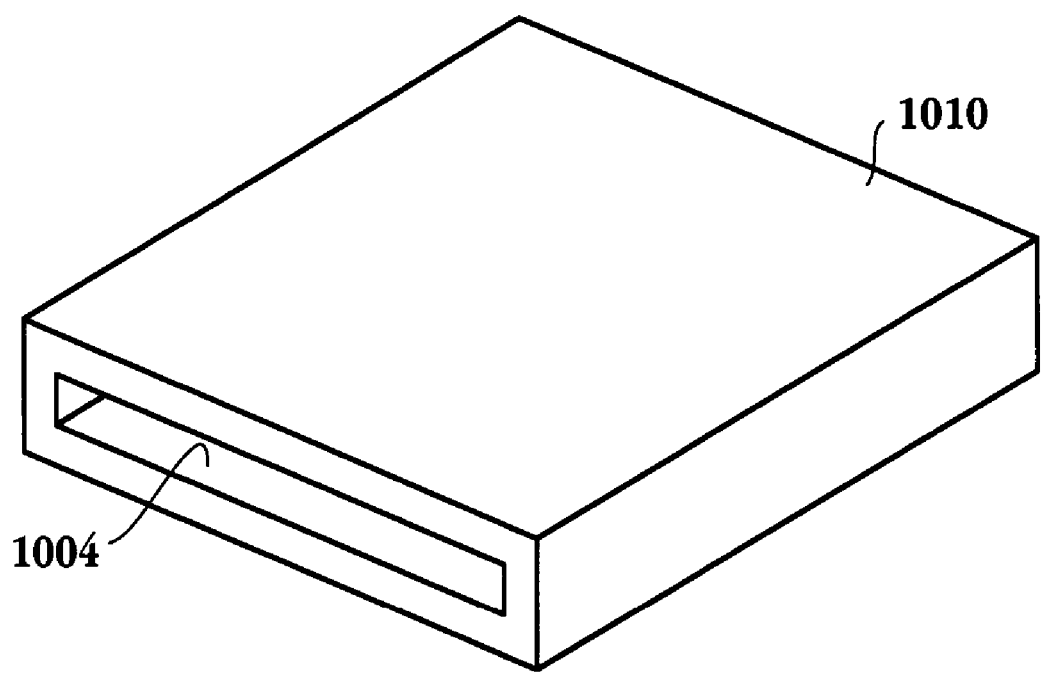
FIG. 10 is a simplified perspective view of another apparatus for cleaning a substrate, in accordance with one embodiment of the present invention.

FIG. 10 is a simplified perspective view of another apparatus for cleaning a substrate, in accordance with one embodiment of the present invention. Apparatus 1010 includes chamber 1004 that has a cavity in a form of a conduit. As will be explained in more detail below, the conduit is configured to convey a flow of a non-Newtonian fluid such that a portion of the flow exhibits plug flow. Chamber 1004 is additionally configured to contain a substrate such that the plug flow moves over surfaces (top and bottom surfaces) of the substrate to enable removal of the particles from the surfaces of the substrate. FIG. 10 shows that the cavity has a rectangular shape. However, it should be appreciated that the cavity may be defined by any suitable shape dimensioned to accommodate the substrate. For example, in another embodiment, the cavity can have a cylindrical shape.

Figure 11A:
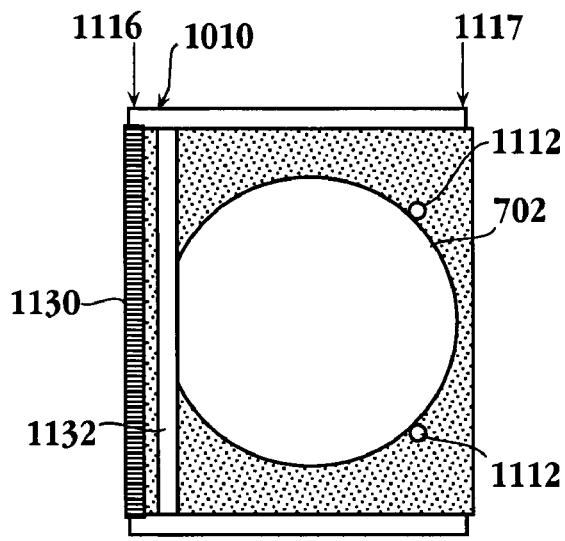
FIGS. 11A-11C show various, more detailed views of the apparatus shown in FIG. 10 for cleaning a substrate, in accordance with one embodiment of the present invention.
Figure 11B:
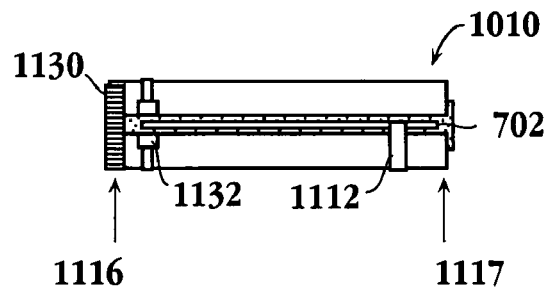
Figure 11C:
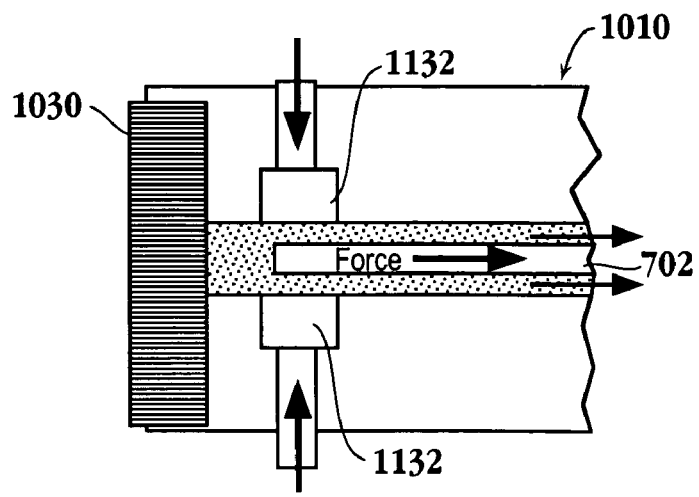

FIG. 11 shows various, more detailed views of the apparatus shown in FIG. 10 for cleaning a substrate, in accordance with one embodiment of the present invention. FIG. 11 illustrates a top view, a side view, and an expanded side view of apparatus 1010. Apparatus 1010 includes a chamber, input ports 1132, holding pins 1112, and panel 1130. The chamber has a cavity in a form of a rectangular conduit. The chamber has input end 1116 and output end 1117 that is located opposite to the input end. Input end 1116 is defined by a first opening that is capable of receiving substrate 702. Output end 1117 is defined by a second opening that is capable of outputting substrate 702. Additionally included is panel 1130 proximate to the first opening at input end 1116 that can be used to seal off the first opening.

Apparatus 1010 also includes input ports 1132 in the walls of the chamber. Input ports 1132 are configured to port the non-Newtonian fluid into the chamber. As shown in the top view of FIG. 11, in one embodiment, input ports 1132 extend along a width of the chamber. However, it should be appreciated that input ports 1132 can have any suitable shapes and sizes. A non-Newtonian applicator (not shown) can be coupled to input ports 1132 to port non-Newtonian fluid into the chamber through the input ports. In the embodiment of FIG. 11, apparatus 1010 includes two input ports 1132 located proximately to input end 1116. The side view shows that one of the input ports 1132 is located at the top of the chamber and the other input port is located at the bottom of the chamber. Input ports 1132 are placed opposite to each other in order to create opposing flows of the non-Newtonian fluid from the top and bottom. The opposing flows assist in keeping substrate 702 suspended in the middle of the chamber by exerting forces on opposite surfaces of the substrate. However, depending on the desired direction of flow, apparatus 1010 can include one input port or more than two input ports. Further, input ports 1132 are located proximate to input end 1116 because the desired direction of flow is from the input end to output end 1117. Nonetheless, it should be appreciated that input ports 1132 may be placed in any suitable location within the chamber to create different flow characteristics.

Still referring to FIG. 11, before substrate 702 is placed into the chamber of apparatus 1010, a non-Newtonian fluid applicator forces non-Newtonian fluid into the chamber through input ports 1132 to fill the chamber with the non-Newtonian fluid. After the chamber is filled with the non-Newtonian fluid, substrate 702 is placed in the chamber though the first opening at input end 1116. Substrate 702 is placed such that the substrate is suspended in the non-Newtonian fluid. In other words, substrate 702 is immersed in the non-Newtonian fluid and is not in contact with a wall of the chamber. The non-Newtonian fluid has the capability to support substrate 702 such that the substrate is suspended in the middle of the chamber. The non-Newtonian fluid can support substrate 702 almost indefinitely, even without flow, because the weight of the substrate is sufficiently small such that the substrate resting on the non-Newtonian fluid does not exceed the yield point of the non-Newtonian fluid.

After substrate 702 is placed into the chamber, panel 1130, which is proximate to the first opening at input end 1116, closes to seal off the first opening. The non-Newtonian fluid applicator then forces additional non-Newtonian fluids into the chamber to create a flow of the non-Newtonian fluid. Since the non-Newtonian fluid cannot exit through the first opening at input end 1116, the non-Newtonian fluid forced through input ports 1132 flows from the input end towards output end 1117 to exit at the second opening at the output end. The direction of the flow is substantially parallel to surfaces of substrate 702. As will be explained in more detail below, a portion of the flow exhibits plug flow, and the substrate is placed within the chamber such that the plug flow moves over surfaces of substrate 702 to remove particles from the surfaces.

To enable the flow to move over surfaces of substrate 702, the substrate is held within the chamber. Embodiments of apparatus 1010 can include one or more holding pins 1112 within the chamber. Holding pins 1112 are used to receive an edge of substrate 702 to prevent horizontal movement of the substrate. In the embodiment of FIG. 11, holding pins 1112 are located proximate to output end 1117 to prevent substrate 702 from moving through the second opening at the output end when the non-Newtonian fluid flows though the chamber. Holding pins 1112 can hold substrate 702 while enabling the non-Newtonian fluid to flow through the conduit. To allow horizontal movement of substrate 1112, holding pins 1112 may be configured to release a hold of the substrate to allow the flow of the non-Newtonian fluid to move the substrate along the conduit and out of the second opening at output end 1117. For example, in one embodiment, holding pins 1112 can be lowered to allow movement of substrate 702.

Figure 12A:
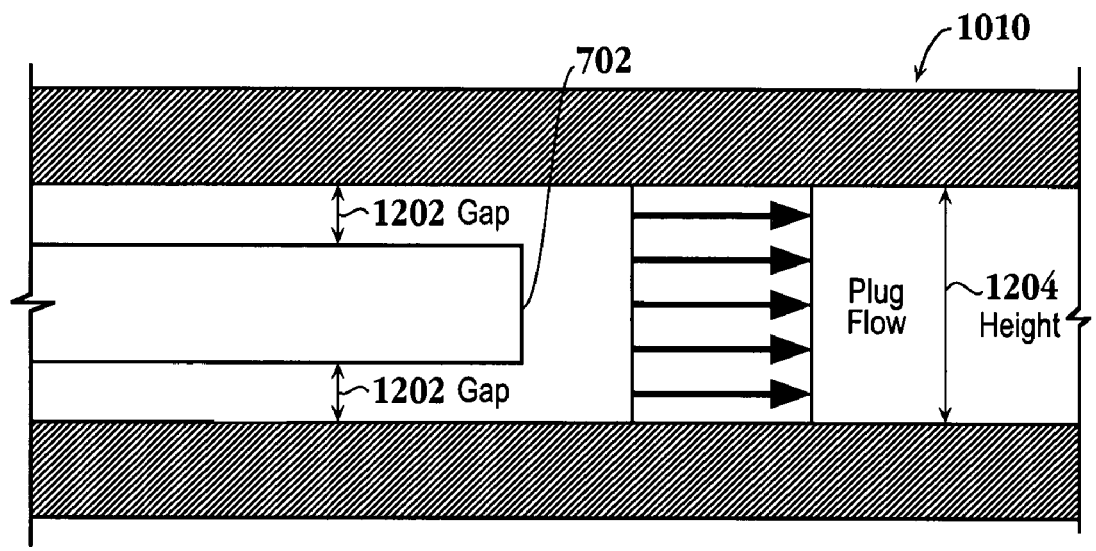
FIGS. 12A and 12B are different velocity flow profiles for different flows of the non-Newtonian fluid through the chamber of FIGS. 10 and 11, in accordance with embodiments of the present invention.
Figure 12B:
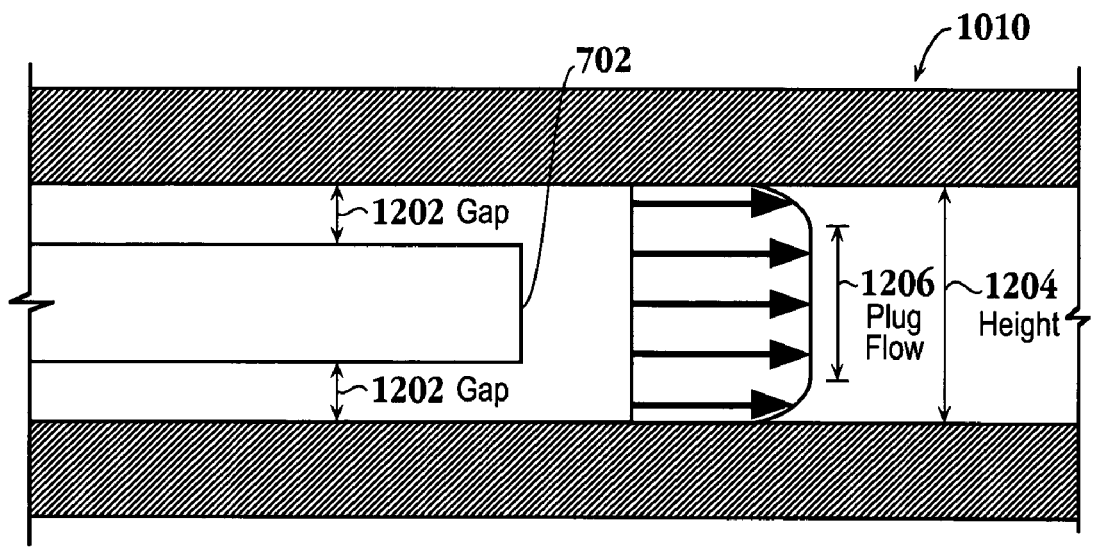

FIGS. 12A and 12B are different velocity flow profiles for different flows of the non-Newtonian fluid through the chamber of FIGS. 10 and 11, in accordance with embodiments of the present invention. The non-Newtonian fluid of FIG. 12A flowing through chamber has a yield point greater than the shear stress applied to the non-Newtonian fluid across height 1204 of the chamber. Accordingly, in one embodiment, a substantial amount of the flow exhibits plug flow. In other words, the plug flow extends to about an entire amount of the flow. Therefore, as shown in FIG. 12A, the flow velocity flow profile is substantially uniform.

FIG. 12B is another velocity flow profile for a flow of non-Newtonian fluid through the chamber, in accordance with another embodiment of the present invention. Here, the shear stress applied to the non-Newtonian fluid flowing through the chamber exceeds the yield point of the non-Newtonian fluid at some portions of the flow. As discussed above, the portions of the flow where the shear stress exceeds the yield point exhibit non-plug flows. The portions of the flow where the yield point is greater than the shear stress exhibit plug flow. As shown in FIG. 12B, the velocity flow profile shows the flow of non-Newtonian fluid having different flow characteristics. Plug flow is not obtained across the entire height 1204 of the chamber. Specifically, portions of the flow near walls of the chamber exhibit non-plug flows, which have parabolic shaped velocity gradients. Plug flow has a flat shaped velocity flow profile and is exhibited at portion 1206 between the velocity gradients.

To exploit the benefits of increased particle removal associated with plug flow, substrate 702 is placed within the chamber such that the portion of the flow exhibiting plug flow moves over a surface of the substrate. With the embodiment shown in FIG. 12A, since plug flow is obtained substantially across the entire height 1204 of the chamber, substrate 702 can be placed anywhere within the chamber. With the embodiment shown in FIG. 12B, substrate 702 is placed within portion 1206 that exhibits plug flow. It should be appreciated that gaps 1202 between the walls of chamber and the surfaces of substrate 702 can have any suitable height to accommodate the flow of non-Newtonian fluid. In one exemplary embodiment, gap 1202 has a height in a range from about 50 microns to about 10 millimeters.

It should be appreciated that chemicals and/or gases in the non-Newtonian fluid can further assist in the removal of particles from surfaces of substrate 702. Specifically, chemicals and/or gases can be included in the non-Newtonian fluid to chemically react or to facilitate chemical reactions with the particles and/or surfaces of substrate 702. Any suitable chemicals and/or gases can be included in the non-Newtonian fluid to facilitate substrate cleaning. For example, foam that is comprised of ozone bubbles and deionized water can be applied to a substrate. The ozone in combination with the deionized water chemically reacts with an organic photoresist material, which is commonly used in semiconductor photolithography operations, to remove the photoresist material from surface of substrate 702.

Furthermore, it should be appreciated that in addition to cleaning, the embodiments described above can be applied to other suitable semiconductor device manufacturing processes that depend on mass transfers. For example, a plug flow of non-Newtonian fluid can be used for plating, which is a surface-covering technique in which a metal is coated onto a surface. The application of a flow of non-Newtonian fluid exhibiting plug flow onto a surface to be plated results in high velocity at or near the surface. The high velocity equates to a high mass transfer of metal onto the surface, thereby reducing the amount of fluid used to coat the surface. In another example, the embodiments described above can be applied to wet etching, where a flow of the non-Newtonian fluid (e.g., a chemical etchant) exhibiting plug flow is applied onto a surface of a substrate to remove a material being etched.

In summary, the above-described embodiments provide methods and apparatuses for cleaning a substrate. To clean a surface of the substrate, the substrate is placed in contact with a flow of non-Newtonian fluid that exhibits plug flow. For the same transfer of mass, plug flow has a higher flow velocity at or near the surface of the substrate when compared to the use of a Newtonian fluid, such as water, to clean a substrate. The friction created by the plug flow at the surface of the substrate is by orders of magnitude higher than the negligible friction created by the Newtonian fluid. As a result, the use of a non-Newtonian fluid exhibiting plug flow to clean substrates is more efficient than the use of a Newtonian fluid because less non-Newtonian fluid is used to achieve the same cleaning effect when compared to the use of the Newtonian fluid.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A method for cleaning a substrate, comprising:
    filling a chamber with a non-Newtonian fluid, the chamber having an input end and an output end;
    introducing the substrate into the chamber at the input end and suspending the substrate suspended in the non-Newtonian fluid;
    closing access to the input end;
    forcing additional non-Newtonian fluids through the chamber such that a flow of the non-Newtonian fluid moves the substrate toward the output end; and
    activating a pin to block the substrate from moving through the output end while forcing the additional non-Newtonian fluid, the pin contacting an edge of the substrate, wherein the non-Newtonian fluid flows over surfaces of the substrate and the non-Newtonian fluid exits at the output end.

2. The method of claim 1, further comprising:
    preventing the substrate from moving within the chamber while enabling the non-Newtonian fluid to flow through the chamber.

3. The method of claim 1, wherein the input end and the output end oppose each other.

4. The method of claim 3, further comprising:
    releasing the pin to enable the substrate to exit out of the output end.

5. The method of claim 1, wherein the non-Newtonian fluid is defined as one or more of a foam, a colloid, and an emulsion.

6. The method of claim 1, wherein closing access to the input end includes,
    closing a panel to close the access to the input end; and
    continuing to fill the chamber through opposing input ports.

7. The method of claim 1, wherein the filling includes:
    inputting the non-newtonian fluid through opposing top and bottom input ports.

* * * * *